US006850851B1

(12) United States Patent
Fourestie et al.

(10) Patent No.: US 6,850,851 B1
(45) Date of Patent: Feb. 1, 2005

(54) METHOD AND DEVICE FOR NEAR-FIELD MEASURING OF NON-CONTROLLED RADIATION

(75) Inventors: Benoit Fourestie, Paris (FR); Zwi Altman, Chatillon (FR); Joe Wiart, Lagny (FR); Gerard Grandsimon, Clamart (FR); Jean-Charles Bolomey, Paris (FR)

(73) Assignee: France Telecom, Paris (FR)

( * ) Notice: Subject to any disclaimer, the term of this patent is extended or adjusted under 35 U.S.C. 154(b) by 0 days.

(21) Appl. No.: 10/048,604

(22) PCT Filed: Feb. 8, 2000

(86) PCT No.: PCT/FR00/02231

§ 371 (c)(1),
(2), (4) Date: May 6, 2002

(87) PCT Pub. No.: WO01/09626

PCT Pub. Date: Feb. 8, 2001

(30) Foreign Application Priority Data

Aug. 3, 1999 (FR) ............................................ 99 10213

(51) Int. Cl.[7] .............................................. G06F 17/00
(52) U.S. Cl. ....................... 702/65; 343/703; 324/76.11
(58) Field of Search ............................. 702/60, 64, 65; 343/703; 324/76.11

(56) References Cited

U.S. PATENT DOCUMENTS

| 5,365,241 A | * | 11/1994 | Williams et al. ............ 343/703 |
| 5,432,523 A | * | 7/1995 | Simmers et al. ............ 343/703 |
| 5,485,158 A | * | 1/1996 | Mailloux et al. ........... 342/165 |
| 5,773,974 A | * | 6/1998 | Kraz .......................... 324/258 |
| 6,191,744 B1 | * | 2/2001 | Snow et al. ................. 343/703 |
| 6,456,070 B1 | * | 9/2002 | Kazama et al. ............. 324/260 |
| 6,657,596 B2 | * | 12/2003 | Djuknic ...................... 343/703 |

OTHER PUBLICATIONS

Taaghol et al., "Near–Field to Near/Far–Field Transformation for Arbitrary Near–Field Geometry, Utilizing an Equivalent Magnetic Current", IEEE, 1996.*

Fourestie et al., "Statistical Modal Analysis Applied to Near–Field Measurements of Random Emissions", IEEE, 2002.*

Paker et al., "Application of Adaptive Algorithms for Near–Field Far–Field transformation", IEEE, 1996.*

Laroussi et al., "Far–Field Predictions from Near–Field Measurements Using an Exact Integral Equvation Solution", IEEE, 1994.*

Regue et al., "A Genetic Algorithm Based Method for Predicting Far–Field Radiated Emissions from Near–Field Measurements", IEEE, 2000.*

Narasimhan et al., "An Efficient Technique for Spherical Near–Field to Far–Field Transformation and Evaluation of Far Fields of Perfectly Conducting Scatterers", IEEE, 1989.*

"EMC–investigation of hand–held mobile telephones using a double–cone nearfield to farfield transformation" by H. Ruoss et al., XP000682639 EuMC, pp. 795–798, Sep. 1996.

(List continued on next page.)

*Primary Examiner*—Patrick J. Assouad
(74) *Attorney, Agent, or Firm*—Westman, Champlin & Kelly (57) ABSTRACT

An electric field emitted by an electronic equipment is measured by producing at least one radiation measurement in the radiating field of the equipment. Several sets of simultaneous near-field measurements, within a measuring surface located at a short distance from the equipment, are performed. The sets of performed measurements are processed by estimating the statistical properties of the radiated field at any point outside the measuring surface.

60 Claims, 1 Drawing Sheet

OTHER PUBLICATIONS

"The UCLA Bi–Polar Planar–Near–Field Antenna–Measurement and Diagnostics Range" by Y. Rahmat et al., XP 000552175, pp. 16–35, *IEEE Antennas & Propagation Magazine*, vol. 37, No. 6, Dec. 1995.

Spherical Near–Field Facility for Microwave Coupling Assessments in the 100MHz–6GHz Frequency Range: by D. Serafin et al., XP002136104, pp. 225–234 *IEEE Transactions on Electromagnetic Compatibility*, vol. 40, No. 3, Aug. 1998.

"3–D Electromagnetic Field Modeling Based on Near Field Measurements" by A. Roczniak et al., XP 000852501, pp. 1124–1127, *IEEE Instrumentation and Measurement Technology Conference*, Jun. 1996.

"Near–Field Characterization of PCBs For Radiated Emissions Prediction" by J. Lauren, Proceedings of the International Symposium on Electromagnetic Capability, *IEEE* XP000427692, pp. 322–326, Aug. 1993.

* cited by examiner

*FIG.1*

*FIG.2*

METHOD AND DEVICE FOR NEAR-FIELD MEASURING OF NON-CONTROLLED RADIATION

CROSS-REFERENCE TO RELATED APPLICATION

The present application is a National Stage application of International Application No. PCT/FR00/02231 filed Aug. 2, 2000 and published as WO 01/09626 on Feb. 2, 2001, not in English.

FIELD OF THE INVENTION

The field of the invention involves systems for measuring the electric field emitted by any electronic equipment.

BACKGROUND OF THE INVENTION

The fields radiated from an electronic equipment, which will be named afterwards as "AUT" an abbreviation for "Apparatus Under Test", can be separated into radiation that is intentional, sought and inherent to its operation, and into non-intentional radiation.

Thus, a mobile phone transmits an expected radiation, required for communication, as well as complementary spurious emissions, which are non-intentional. A table-top computer, and in particular its screen, usually emits non-intentional radiation.

Non-intentional radiation can be divided between useful emissions, that is to say carriers of significant information, and non-useful emissions (noise).

At a time when telecommunications systems are enjoying extraordinary expansion, better understanding of emitted radiation is primordial since it is essential to guarantee a certain quality of service and better security of information.

Thus, as an example, the precise measurement of these different signals is indispensable for various applications, in particular:

forecast of radioelectric coverage;
verification of Electromagnetic Compatibility (EMC) and compliance with standards;
hardening and security, that is to say in particular the control and reduction of useful signals emitted;
analysis of the interaction of electromagnetic waves with persons.

The measurements of these different signals are extremely difficult to implement by using present measurement techniques. As shown below, these measurements are even more difficult since the supply to the equipment concerned is not controlled.

Several techniques for measurements of radiation emitted by apparatus are known.

In order to limit emissions of non-intentional signals, competent international standards organizations for EMC, such as the CISPR (International Special Committee on Radio Interference) or the ANSI (American National Standards Institute), have laid out recommendations and set in place maximum non-intentional radiation levels for an AUT in a given configuration, from 30 MHz to 1 GHz. The measurement methods for a parasitic field radiated by an AUT are specified in the normative document of the CISPR 16-1, 1993 "Specifications of methods and measuring apparatus for radio-electric disturbances and immunity from radio-electric disturbances", and also in the ANSI document C63.4-1988 (American national standard: "Methods of measurements of radio noise emissions from low voltage electrical and electronic equipment in the range of 10 kHz to 1 GHz". These documents specify measurements in free space above a perfectly conducting plane.

The measurement protocol recommended by the CISPR has serious disadvantages:

at low frequency, the hypotheses of distant field used are a source of errors;
the measurement antenna is in the Fresnel zone (near field) of the AUT and the structure of the radiated waves is not a plane wave structure contrary to the approximation applied;
coupling phenomena difficult to take into account, and capable of affecting the validity of the measurement, may occur between the AUT and the measurement antenna, or between the antenna and its ground image, and bring about a modification of the value of the antenna factor.
because of the angular truncation above and the influence of the ground, the method does not make it possible to provide a precise diagram of the AUT radiation, nor to describe the emitted signals.
finally, these measurements are specified on normalized measurement sites which can be located in open areas (Open Area Test Site) or semi-echo-free chambers. These sites must be very large sized, are often costly and impractical, and are subject to many imperfections: spurious emissions, disturbing atmospheric phenomena, or furthermore poor performance of absorbents, shielding defects, etc.

Near field (NF) measurement techniques have also been developed relying on the principle that the AUT supply is controlled (see J. Ch. Bolomey et al. "Spherical near-field facility for microwave coupling assessment in the 100 MHz–4 GHz frequency range)" in IEEE Trans. Antennas Propagat. vol. 40, pages 225–234, August 1998). According to this technique, measurements were taken by replacing the supply of the apparatus under study by a controlled supply. In this case, the field irradiated by the modified AUT can be measured at near distance in amplitude and in phase. This measurement is carried out by correlating the supply signal with the signal measured at a point. The field at any point in space can thus be calculated at any distance by using prior art techniques for NF (near field)—FF (far field) transformation.

However, it is clear that in this measurement configuration, the apparatus is not working under its normal utilization conditions, since its supply remains controlled. The validity of this type of measurement is, thus, limited to the measurement conditions (see J. Hald et al. "Spherical near field measurements") Peter Peregrinus, Great Britain, 1998).

It certainly remains possible to carry out measurements without being in control of the source, but then the correlation operation mentioned above cannot be carried out and the near field measurements are in amplitude only. The near field distribution is thus known at a precise measurement distance which does not make it possible to determine the total emitted power. For this, one still has to measure the field in amplitude over a surface surrounding the AUT and located in a field far from the latter. These measurements are difficult and expensive to implement.

Such a method for measuring the near field radiated by an AUT whose supply is not under control has been described by A. Roczniac et al., "3-D Electromagnetic Field Modeling based on Near Field Measurements" in IEEE Conf. on Instruments and measurements, Brussels, Belgium, 1996.

This method consists of measuring the electric field in amplitude only on two concentric hemispheres. By using a minimization algorithm, the phase is recalculated on one of the two hemispheres. However, according to the authors, this method has not been able to provide reliable limits for radiated electric field at every distance from the AUT.

Finally, a method for processing the data measured, called the FBAB method below for simplification—named after the initials of the inventors—has been proposed by the inventors of the present patent application in "Extension of techniques for near field measurement to the characterization of complex radiation systems in random state", in National Microwave Days, Arcachon, France, May 1999. In this theoretical briefing, included here for reference, it is implicitly admitted, evidently in fictive fashion, that the signals are measured simultaneously at all the measuring points over the surface under consideration. It is theoretically possible to implement this processing method to know all the useful values mentioned above. But this hypothesis of simultaneous measurement at all points of the surface is not realistic because the complexity of the measuring apparatus needed would rule it out.

Finally, techniques are known, developed in reverberation chambers, with the following principle: the AUT is placed in a chamber with variable geometry over time, and with perfectly conductive walls. Then it is shown that, under certain conditions, one can measure at any point in the cavity the total average power radiated by the AUT (see J. Page "Stirred mode reverberation chambers for EMC measurements and radio type approvals" IEE 1998). Nonetheless this method of measurement is still not completely mastered and strict precautions have to be taken during the measurement of highly dispersive systems. Because of multiple reflections, the measurement of the radiation diagram of the AUT as well as the analysis of the shape of the signals emitted cannot be envisaged.

As far as present techniques for hardening measurement are concerned, that is to say techniques aimed at analyzing the "useful" signals emitted by an apparatus, that is the non-intentional signals containing information, it has been assumed until now that these signals are known a priori and it is verified that their level remains lower than threshold levels. No method for hardening measurement has been specified at present. Furthermore, present measurements do not make it possible to provide a radiation diagram associated with a useful signal, nor to know the total radiated power associated with this signal. In this sense, hardening measurements carried out at present by prior art methods remain very incomplete.

The aim of the present invention is to overcome these different disadvantages and limits of prior art.

More precisely, a first aim of the invention is to provide a method for near field measurement making it possible to measure, in normal utilization conditions, and with precision, all its radiation characteristics, including the radiated power, the diagram of radiation at any distance, as well as the shape of signals emitted associated with the radiation diagram of each of these signals.

A further aim of the invention is to develop a measurement technique capable of using the theoretical method developed by the same inventors, mentioned above, in a device of reduced complexity which nonetheless makes it possible to acquire the necessary data.

Another aim of the invention is to provide such a measurement method which can be exploited with compact measuring bases, of small dimensions.

A final aim of the invention is to provide a device for implementing such a procedure.

SUMMARY OF THE INVENTION

These aims, together with others which will become clear later, are achieved according to the invention with the aid of a method for determining the properties of the radioelectric radiation emitted by an apparatus, of the type consisting of making at least one radiation measurement in the radiation field of the apparatus, characterized in that it consists of carrying out a plurality of sets of simultaneous near field measurements, within a measurement surface located near to the apparatus, and of applying an estimation method of the statistical properties of radiated fields at any point outside the measurement surface from the sets of measurements carried out.

In fact, it is thanks to the production of these sets of simultaneous measurements in radiated near field that it is possible to set in place a digital processing analysis of the shape of the signals emitted, and to determine their radiation diagram. Advantageously, the processing uses the FBAB method, which enables reconstruction of useful far fields for studies of Electromagnetic Compatibility or furthermore for cellular telephony. This method applies processing techniques for the signals measured on the antenna networks to the problems of near field radiation and is essentially a method for estimating the coherence of the signals measured in the spatial domain to reduce the measured set of unknown radiation to an equivalent number of non-coherent sources (in time).

The FBAB method is better adapted to the characterization of emissions from electronic equipment, since it adopts the hypothesis that the radiations measured are constituted of stochastic signals, and not determinist signals. Furthermore it makes it possible to use more precise near field measuring devices with smaller dimensions.

According to another characteristic of the invention, the production of the plurality of simultaneous sets of measurements consists of determining an ensemble of measuring points sampling the measuring surface, to choose the number of points for simultaneous measurement which will be measured for each set of measurements (typically two, to form couples of measurement points, but also if appropriate 3 or 4, or more), and of carrying out successive measurements on all the combinations of sets of measurement points possible in the ensemble of determined points.

According to another important characteristic of the invention, the method includes a pre-processing for diminution of the complexity, consisting of:

on the one hand carrying out a preliminary estimation of the zones with high radiation in the measurement surface;

then giving privilege first of all to the measurements involving the points of measurement located in priority in the high radiation zones;

and finally filling up the expected matrix of intercorrelation with the first sets of measurement by beginning with the priority measurement points, column by column, until the matrix becomes singular. At this moment, it can be considered that the ensemble of radiations possible has been taken into account, and that the measurement procedure has been finished. Thus, the matrices to be manipulated to determine the combination of non-coherent sources equivalent to the radiation of the measured apparatus are then much smaller than the complete square matrices (in the case where one has chosen to carry out measurement couples), and therefore make the process feasible.

The radiation characteristics determined by the method according to the invention advantageously belong to the group comprising the power radiated by the apparatus, the shape of the signals emitted, and the radiation diagram of the emitted signals.

According to an advantageous characteristic of the invention, the sets of simultaneous measurement are carried out with the aid of a number of sensors equal at least to the number of simultaneous measurements made, the sensors allowing a measurement of the radiated field according to at least two polarizations.

According to another characteristic of the invention, the measurement surface is generic and belongs to the group comprising planes, cylinders and spheres, the sensors assuring the measurement of radiated field allowing measurement of the field according to two polarizations.

On the other hand, when the measuring surface is not generic, the sensors assuring the radiated field measurement must then allow a field measurement according to three polarizations.

Advantageously, the sensors belong to the group comprising the antennae with a high level of polarization decoupling, and the "active" sensors.

Preferably, the sets of simultaneous measurements are constituted of couples of simultaneous measurements, but they can also be constituted of numbers of simultaneous measurements greater than two, such as triplets and quadruplets of simultaneous measurements.

Advantageously also, the distance of near measurement is a maximum of several meters, preferably of the order of one meter.

When this is necessary in order to establish complete radiation diagrams, the measurement surface envelops the apparatus.

The invention also relates to a device for implementing the method as described above.

According to the invention, a preferred embodiment of the device comprises a first support frame comprising receptions means for a measuring apparatus and a second support frame mobile relative to the first support frame, each of the two support frames being provided with at least one measuring sensor.

Advantageously, the first support frame receiving the measuring apparatus comprises a turning plate for reception of the apparatus, integral with a support arm for a measuring sensor forming a reference probe, the ensemble being mobile in rotation around a vertical rotation axis passing substantially through the center of the turning plate.

The second support frame is then advantageously constituted by a fixed arch whose internal profile essentially describes a generatrix of the measuring surface, typically a right angle segment, or a circle centered on the positioning zone of the apparatus to be measured.

This fixed arch is provided with a plurality of sensors arranged around the internal circular profile of the arch.

According to another advantageous characteristic of the invention, the first support frame comprises means for disengaging from the turning plate relative to the support arm, in such a way as to allow a rotation of 360° of the turning disc when the support arm comes as a stop against the second support frame.

As for the sensors, they are advantageously positioned at a distance less than or equal to about a meter from the positioning zone of the apparatus to be measured.

At least some of the sensors are preferably constituted by a so-called "Jerusalem cross" antenna.

The method and the device are advantageously applied to the measurement of the radiation from apparatus where the supply is not controlled.

Furthermore, these systems have many advantages as follows, concerning measurements of electromagnetic compatibility because, apart from the reduction of operating costs:

they avoid any angular truncation, and make it possible to establish a radiation diagram of the AUT at any distance;

they offer better positioning and implementation conditions for measurements;

they enable better forecasting of possible perturbations due to the AUT through a statistical characterization of the signals emitted by the AUT according to the angular directions;

they make it possible to compensate for the influence of the environment, or at least to take this influence into account better.

Finally, these systems allow hardening measurements to be carried out from analysis of the measured signals, and enable studies of interaction of waves by persons reading the radiation diagram at a very short distance from the measured apparatus.

BRIEF DESCRIPTION OF THE DRAWINGS

Other characteristics and advantages of the invention will become clear by reading the following description of a preferred embodiment of the invention, as an illustrative but non-limiting example, and the attached diagrams, in which.

Figure 1:
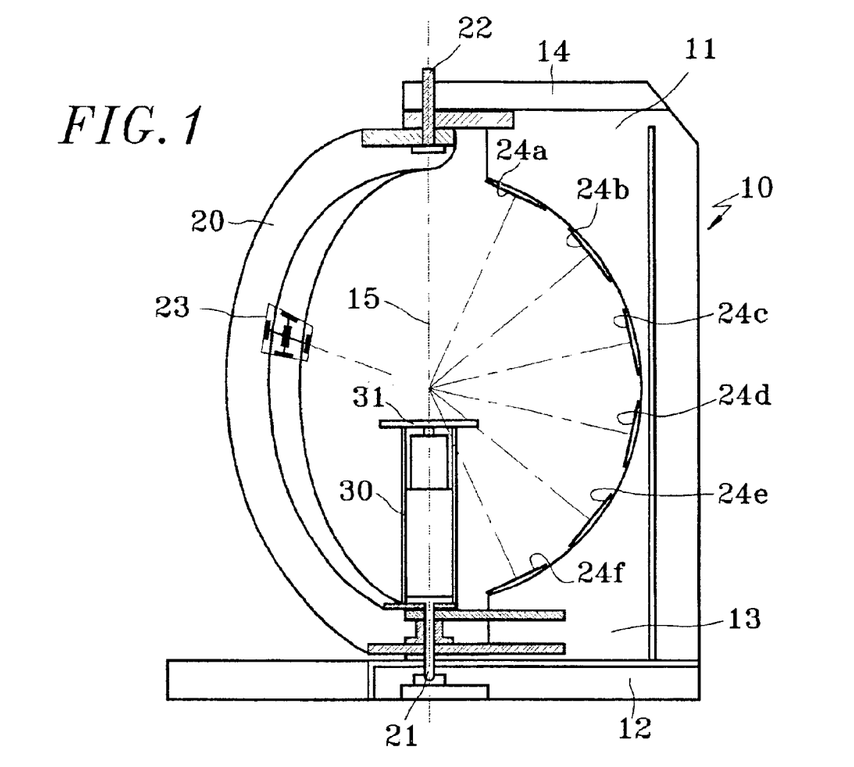
FIG. 1 is a side view of a measuring device according to the invention.
Figure 2:
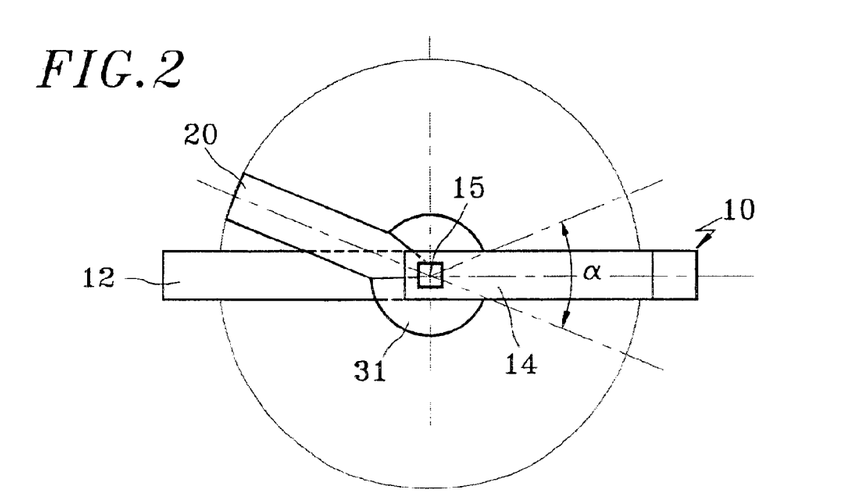
FIG. 2 is a view from above of the device in FIG. 1.

The device shown in FIGS. 1 and 2 is an original spherical positioner making it possible to collect all the data necessary for implementing the measuring method according to the invention, and for processing the associated data. It is especially adapted for carrying out measurements on mobile phone equipment at 900 or 1800 MHz.

DETAILED DESCRIPTION OF THE PREFERRED EMBODIMENTS

The device is constituted of a fixed support frame 10 comprising an arch 11 mounted on a base 12. Between the lower 13 and upper 14 branches of the arch a second support frame 20 is installed which is mounted to pivot around pivots 21, 22. This pivoting support frame 20 forms a curved arm usually integral with a turning plate 30 adjustable in height and comprising a reception platform 31 for the apparatus to be analyzed (the AUT, not shown here). The arm 20 and the plate 30 can nonetheless be separated from each other by disengagement.

As can be seen in the view from above (FIG. 2), the mobile arm 20 is able to follow a course of practically 360° around the axis of rotation 15. However, in an angular zone next to the arch 11 of the fixed frame 10, the arm 20 comes up against the stop of the arch 11. At this moment, it is thus possible to allow the plate 30 to finish a complete turn, up to 360°, by disengaging it from the mobile arm 20.

The mobile arm 20 is equipped with a sensor 23, constituted of an antenna forming a reference probe, attached to the AUT.

The fixed arch 11 itself comprises a certain number of sensors 24, 6 sensors in this case, 24a–24f.

The circular shape of the internal profile of the pivoting arm 20, like the fixed arch 11, allows the turning plate, and thus the AUT, to be located in the center of a sphere described by the relative movement of the sensors 24a–f relative to the turning plate 30. In this case the radius of the sphere is less than one meter, for example of the order of 800 mm.

This same device could also be adapted, for example, to form a cylindrical positioner. In this other embodiment (not shown), the pivoting arm 20 like the fixed upright 11 can have a straight profile (instead of the circular profile of the embodiment of FIGS. 1 and 2). The displacement of the turning plate 30 and the mobile arm 20 relative to the fixed upright 11 generate a cylindrical measurement surface which allows a satisfactory radiation diagram to be drawn up if one is able to ignore the angle at which the apparatus under test confronts the end faces of the measurement cylinder.

The spherical positioner is made entirely out of a material which is non-invasive for radioelectric waves, for example PVC.

The AUT radiation is measured at two points of the sphere simultaneously, for the ensemble of point couples considered to be useful.

The sensors 23 and 24a–f allow measurement couples to be taken, a first measurement of each couple being taken by one of the antennae 24a–f and the other being carried out by the reference antenna 23.

For the positions where the mobile arm 20 is disengaged from the plate 30, it is one of the antennae 24a–f of the fixed arch 11 which acts as reference sensor.

The number of sensors 24 used can be chosen in function of the aims and in particular in function of the size of the AUT as well as the frequency and measurement precision required.

The field emitted by the AUT must be measured at a certain number of points, which constitute the same number of samples of close surface measurement of the AUT, in this case the sphere described by the sensors relative to the AUT. Since the spherical positioner makes measurements possible over 360°, it is then possible to draw up a total radiation diagram for the apparatus measured.

The number of sensors also affects the length of the measurement phase. In the embodiment shown, it was decided to make six measurements for each position of the AUT, which meant positioning the six measurement antennae 24a–f on the fixed arch.

Since the sphere described by the apparatus is a generic surface, one can therefore only measure two polarizations of the signals, following the parallels of the sphere on the one hand and the meridians on the other.

The antenna-sensors used in the device according to the invention, as far as the reference sensor and the antennae positioned on the fixed arch are concerned, are advantageously of the type described in U.S. Pat. No. 6,281,849 entitled "Printed bi-polarization antenna and corresponding network antennas" (corresponding to French Patent Application No. 99 10105), which is incorporated herein by reference. In this preferred embodiment, these antennae are constituted of the combination of two double dipoles, which gives them the look of a Jerusalem cross. Each of the double dipoles is printed on one face of the antenna substrate, and measures a polarization of the incidental wave (polarization according to a meridian or polarization according to a parallel). The insulation level for crossed polarization between the two dipole couples is advantageously of the order of 40 dB at 900 MHz.

Since each antenna is constituted by a dipole couple, and as a result comprising 2 outputs, the device has 14 outputs.

The decomposition into spherical modes of this type of antenna is known in prior art, which makes it possible to make a probe correction, and to arrive precisely at the electrical field incident on the structure.

But it is also possible to use other types of antennae compatible with the type of measurements made, for example "active" sensors (typically field sensors) which have greater sensitivity for the same overall dimensions.

The method according to the invention comprises a phase of measurement acquisition, and a phase for processing the signals measured.

As far as the measurement acquisition phase is concerned, first of all one has to determine an ensemble of measurement points sampling the measurement surface, and then choose the number of simultaneous measurement points which will be measured for each measurement set, and to produce successive measurements over all the combinations of sets of measurement points possible in the ensemble of determined points. In this case, if the ensemble of points sampling the measuring surface comprises 72 points, and if one chooses to carry out simultaneous measurement couples, one has to carry out $72 \times 72 = 72^2$ sets of measurements, whose results will be provided for an intercorrelation expectation matrix comprising 72 lines and 72 columns.

The simultaneous acquisition of two signals, for each couple of simultaneous measurements, can be carried out by using a commutation matrix. The cables connecting the antennae outputs with the commutation matrix must have the same length so that the propagation time is the same for all the signals. The insulation between tracks in the matrix must be greater than 40 dB.

The acquisition apparatus must make it possible to sample the incoming signals from the matrix. This sampling can be carried out directly, for example by rapid oscilloscope, or after transposing the signal to an intermediate frequency with the aid, for example, of an analyzer of vector signals.

The FBAB method will now be described, in relation to the above publication describing this method.

As already indicated, the signal processing implemented within the framework of the invention is compatible with the unforeseen and random temporal behavior of signals emitted by the electronic apparatus to be studied. The radiations collected are filtered in order to bring them within narrow band signals. The total field measured on the measurement surface is decomposed into the sum of the radiations of narrow band equivalent sources supplied by weakly stationary and perfectly de-correlated signals two by two. This decomposition makes it possible to calculate the statistical properties of the total field at any external point of the measurement surface.

If it is assumed that the measurement surface is spherical, the narrow band complex field $E(M, f_0, t)$ radiated by an electronic equipment at the point M can be described by:

$$\overline{E}(M, f_0, t) = \overline{E}_{harm}(M, f_0) \cdot z(t),$$

where $\overline{E}_{harm}(M, f_0)$ is the field radiated by this equipment if supplied by a carrier normalized in amplitude at frequency $f_0$, and $z(t)$ is a complex stationary stochastic procedure taking into account the random character of the emissions.

Everything takes place as if the field of the carrier frequency $f_0$ were modulated by the base band signal $z(t)$.

The field at each measurement point results from the addition of radiations from de-correlated equivalent sources. In order to reconstruct near fields radiated by each of these sources, one tries to determine the coherence of the signals at different measurement points, over time and at frequency $f_0$. In order to achieve this, one studies the function of conjoint spectral or inter-spectral density. For two real signals measured at two points K and L of the measurement surface, sk(t,T) and sl(t,T), associated base band signals zk(t,$f_0$) and zl(t,$f_0$), the inter-spectrum function at frequency $f_0$, $G_{k,l}(f_0)$, generally complex is defined by:

$$G_{k,l}(f_0) = \lim_{\Delta f \to 0} \lim_{T \to \infty} \frac{l}{T\Delta f} \int_0^T zk(t, f_0) z_i^*(t, f_0) dt.$$

The exponent * describes the conjugated complex. By measuring the fields emitted simultaneously for all the couples of points of the surface for a finite number l of temporal samples, one can form the G matrix of expected value intercorrelation, in general terms:

$$G(k,l) = [E\{G_{kl}(f_0,i)\}_{i \in [1,l]}]$$

where G is a Hermitian matrix which can be decomposed under the form $G = USU^T$, where S is the diagonal matrix of singular values of G, and U the matrix for singular vectors of G. The number p ($p \leq N$) for dominant singular values of G is equal to the number of equivalent sources. The p first vector columns of U form the under-space of the signal; the N–p remaining form the noise under-space. The vector column Uk,(1=k=p), represents the near field radiation diagram of the $k^{th}$ equivalent source. This near field diagram is normalized because of $\|U_k\|=1$. The p biggest singular values are average quadratic values of supply signals from different sources.

Advantageously, the phase for processing the measurement signals acquired comprises a first stage of pre-processing measurement data before implementing the FBAB method.

In effect, the measured data are preferably pre-processed in order to reduce the complexity of the measurement, and thus significantly diminish the length of measurement of an AUT. This pre-processing is advantageously carried during the measurement procedure.

The pre-processing is carried out in the following way.

First of all, a first estimation is made of the high radiation zones in the measurement surface, by carrying out only amplitude measurements to begin with, with the aim of privileging first of all the measurements involving the measurement points located in priority in the high radiation zones.

The reference antenna-sensor is then positioned in the zones of high radiation in order to proceed with complete measurements. For each reference antenna position, a new column of the intercorrelation matrix is filled up, mentioned above in the description of the FBAB method. The rank of the new matrix is estimated. When the matrix becomes singular with the adjunction of a new column, the ensemble of possible radiations has been taken into account and the measuring procedure can be stopped.

It is this pre-processing stage which allows a very significant reduction of the quantity of measurements required, and which makes possible the utilization of the device according to the invention.

What is claimed is:

1. Apparatus for determining radio-electric radiation characteristics emitted by a device, the apparatus comprising:
   at least one sensor so disposed and arranged relative to the device to produce a plurality of sets of simultaneous near field radiation measurements in a measurement surface in the radiation field of the apparatus;
   means for determining an ensemble of measurement points sampling the measurement surface, to choose the number of points for simultaneous measurement which will be measured for each set of measurements, and to produce successive measurements on all the combinations of sets of measurement points which can be produced in the ensemble of determined points; and
   a processor arranged responsive to said sets of measurements for estimating at least one statistical property of the radiated fields at a point outside the measurement surface.

2. Apparatus according to claim 1, characterized in that it comprises a first support frame comprising reception means for a measuring apparatus and a second support frame mobile relative to said first support frame, each of the support frames being provided with at least one measuring sensor.

3. Apparatus according to claim 1, characterized in that said first support frame receiving the apparatus to be measured comprises a reception platform for said apparatus, integral with a support arm of a measuring sensor forming a reference probe, the ensemble being mobile around a vertical rotation axis passing substantially though the centre of said reception platform.

4. Apparatus according to claim 1, characterized in that said second support frame is constituted of a fixed arch whose internal profile essentially follows a generatrix of the measurement surface, typically a right angle segment or a circle centered on the positioning zone of said apparatus to be measured.

5. Apparatus according to claim 1, characterized in that said fixed arch is provided with a plurality of sensors arranged around the internal circular profile of the arch.

6. Apparatus according to claim 1, characterized in that said first support frame comprises means for disengaging the reception platform relative to the support arm, in such a way as to allow a rotation over 360° of said reception platform when the support arm comes up against a stop of the second support frame.

7. Apparatus according to claim 1, characterized in that said sensors are positioned at a distance less than or equal to about one meter from the positioning zone of said apparatus to be measured.

8. Apparatus according to claim 1, characterized in that at least certain of said sensors are each constituted by a so-called "Jerusalem cross" antenna.

9. Apparatus according to claim 1, wherein the supply of the apparatus is not controlled.

10. Method for determining radio-electric radiation characteristics emitted by an apparatus, of the type comprising producing at least one radiation measurement in the radiation field of the apparatus, wherein said method comprises the steps of:
   carrying out a plurality of sets of simultaneous near field measurements, within a measurement surface located close to the apparatus, by determining an ensemble of measurement points sampling the measurement surface, to choose the number of points for simultaneous measurement which will be measured for each set of measurements, and to produce successive measurements on all the combinations of sets of measurement points which can be produced in the ensemble of determined points; and
   applying a processing method of said sets of measurements carried out comprising estimating the statistical properties of the radiated fields at any point outside the measurement surface.

11. Method according to claim 10,
characterized in that said sets of simultaneous measurements are produced with the aid of a number of sensors at least equal to the number of simultaneous measurements made, said sensors making possible a measurement of the radiated field according to at least two polarizations.

12. Method according to claim 11, characterized in that said measurement surface is generic and belongs to the group comprising planes, cylinders and spheres, and in that said sensors ensure said measurement of the radiated field making possible a measurement of the field according to two polarizations.

13. Method according to claim 11, characterized in that said sensors ensure said measurement of radiated field enabling a measurement of the field according to three polarizations.

14. Method according to claim 11, characterized in that said sensors belong to a group comprising antennae with a high level of polarization decoupling, and "active" sensors.

15. Method according to claim 10, in which said processing method comprises a phase for filling up a matrix for intercorrelation estimation making it possible to provide an estimation of the coherence of the signals measured in the spatial domain in order to reduce the measured radiation to an equivalent combination of non-coherent sources, characterized in that the method includes a pre-processing for reduction of complexity, consisting of:
on the one hand carrying out a preliminary estimation of the zones with high radiation in the measurement surface;
then giving privilege first of all to the measurements involving the points of measurement located in priority in said high radiation zones;
and finally filling up the expected value matrix of intercorrelation with the first set of measurement by beginning with the priority measurement points, column by column, stopping the process when the matrix becomes singular.

16. Method according to claim 10, characterized in that said estimation method of statistical properties of radiated fields at any point external to the measurement surface is a data processing method of the FBAB method type.

17. Method according to claim 10, characterized in that the near measurement distance is several meters at maximum.

18. Method according to claim 10, characterized in that said measuring surface envelops the apparatus.

19. Method according to claim 10, characterized in that said radiation characteristics belong to the group comprising the power radiated by the apparatus, the form of the signals emitted and the radiation diagram of said signals emitted.

20. Method according to claim 10, wherein a supply of the apparatus is not controlled.

21. Method for determining radio-electric radiation characteristics emitted by an apparatus, of the type comprising producing at least one radiation measurement in the radiation field of the apparatus, wherein said method comprises the steps of:
carrying out a plurality of sets of simultaneous near field measurements, within a measurement surface located close to the apparatus, wherein said sets of simultaneous measurements are constituted of couples of simultaneous measurements; and
applying a processing method of said sets of measurements carried out comprising estimating the statistical properties of the radiated fields at any point outside the measurement surface.

22. Method according to claim 21 in which said processing method comprises a phase for filling up a matrix for intercorrelation estimation making it possible to provide an estimation of the coherence; of the signals measured in the spatial domain in order to reduce the measured radiation to an equivalent combination of non-coherent sources, characterized in that the method includes a pre-processing for reduction of complexity, consisting of:
on the one hand carrying out a preliminary estimation of the zones with high radiation in the measurement surface;
then giving privilege first of all to the measurements involving the points of measurement located in priority in said high radiation zones;
and finally filling up the expected value matrix of intercorrelation with the first set of measurement by beginning with the priority measurement points, column by column, stopping the process when the matrix becomes singular.

23. Method according to claim 21, characterized in that said sets of simultaneous measurements are produced with the aid of a number of sensors at least equal to the number of simultaneous measurements made, said sensors making possible a measurement of the radiated field according to at least two polarizations.

24. Method according to claim 23, characterized in that said measurement surface is generic and belongs to the group comprising planes, cylinders and spheres, and in that said sensors ensure said measurement of the radiated field making possible a measurement of the field according to two polarizations.

25. Method according to claim 23, characterized in that said sensors ensure said measurement of radiated field enabling a measurement of the field according to three polarizations.

26. Method according to claim 23, characterized in that said sensors belong to a group comprising antennae with a high level of polarization decoupling, and "active" sensors.

27. Method according to claim 21, characterized in that said estimation method of statistical properties of radiated fields at any point external to the measurement surface is a data processing method of the FBAB method type.

28. Method according to claim 21, characterized in that the near measurement distance is several meters at maximum.

29. Method according to claim 21, characterized in that said measuring surface envelops the apparatus.

30. Method according to claim 21, characterized in that said radiation characteristics belong to the group comprising the power radiated by the apparatus, the form of the signals emitted and the radiation diagram of said signals emitted.

31. Method according to claim 21, wherein a supply of the apparatus is not controlled.

32. Method for determining radio-electric radiation characteristics emitted by an apparatus, of the type comprising producing at least one radiation measurement in the radiation field of the apparatus, wherein said method comprises the steps of:
carrying out a plurality of sets of simultaneous near field measurements, within a measurement surface located close to the apparatus, wherein said sets of simultaneous measurements are constituted of a number of simultaneous measurements greater than two, such as triplets or quadruplets of simultaneous measurements; and applying a processing method of said sets of measurements carried out comprising estimating the statistical properties of the radiated fields at any point outside the measurement surface.

33. Method according to claim 32, in which said processing method comprises a phase for filling up a matrix for intercorrelation estimation making it possible to provide an estimation of the coherence of the signals measured in the spatial domain in order to reduce the measured radiation to an equivalent combination of non-coherent sources, characterized in that the method includes a pre-processing for reduction of complexity, consisting of:

on the one hand carrying out a preliminary estimation of the zones with high radiation in the measurement surface;

then giving privilege first of all to the measurements involving the points of measurement located in priority in said high radiation zones;

and finally filling up the expected value matrix of intercorrelation with the first set of measurement by beginning with the priority measurement points, column by column, stopping the process when the matrix becomes singular.

34. Method according to claim 32, characterized in that said sets of simultaneous measurements are produced with the aid of a number of sensors at least equal to the number of simultaneous measurements made, said sensors making possible a measurement of the radiated field according to at least two polarizations.

35. Method according to claim 34, characterized in that said measurement surface is generic and belongs to the group comprising planes, cylinders and spheres, and in that said sensors ensure said measurement of the radiated field making possible a measurement of the field according to two polarizations.

36. Method according to claim 34, characterized in that said sensors ensure said measurement of radiated field enabling a measurement of the field according to three polarizations.

37. Method according to claim 34, characterized in that said sensors belong to a group comprising antennae with a high level of polarization decoupling, and "active" sensors.

38. Method according to claim 32, characterized in that said estimation method of statistical properties of radiated fields at any point external to the measurement surface is a data processing method of the FBAB method type.

39. Method according to claim 32, characterized in that the near measurement distance is several meters at maximum.

40. Method according to claim 32, characterized in that said measuring surface envelops the apparatus.

41. Method according to claim 32, characterized in that said radiation characteristics belong to the group comprising the power radiated by the apparatus, the form of the signals emitted and the radiation diagram of said signals emitted.

42. Method according to claim 32, wherein a supply of the apparatus is not controlled.

43. Apparatus for determining radio-electric radiation characteristics emitted by a device, the apparatus comprising:

at least one sensor so disposed and arranged relative to the device to produce a plurality of sets of simultaneous near field radiation measurements in a measurement surface in the radiation field of the apparatus, wherein said sets of simultaneous measurements are constituted of couples of simultaneous measurements; and a processor arranged responsive to said sets of measurements for estimating at least one statistical property of the radiated fields at a point outside the measurement surface.

44. Apparatus according to claim 43, characterized in that it comprises a first support frame comprising reception means for a measuring apparatus and a second support frame mobile relative to said first support frame, each of the support frames being provide with at least one measuring sensor.

45. Apparatus according to claim 44, characterized in that said first support frame receiving the apparatus to be measured comprises a reception platform for said apparatus, integral with a support arm of a measuring sensor forming a reference probe, the ensemble being mobile around a vertical rotation axis passing substantially though the centre of said reception platform.

46. Apparatus according to claim 44, characterized in that said second support frame is constituted of a fixed arch whose internal profile essentially follows a generatrix of the measurement surface, typically a right angle segment or a circle centered on the positioning zone of said apparatus to be measured.

47. Apparatus according to claim 46, characterized in that said fixed arch 16 provided with a plurality of sensors arranged around the internal circular profile of the arch.

48. Apparatus according to claim 45, characterized in that said first support frame comprises means for disengaging the reception platform relative to the support arm, in such a way as to allow a rotation over 360° of said reception platform when the support arm comes up against a stop of the second support frame.

49. Apparatus according to claim 48, characterized in that said sensors are positioned at a distance less than or equal to about one meter from the positioning zone of said apparatus to be measured.

50. Apparatus according to claim 43, characterized in that at least certain of said sensors are each constituted by a so-called "Jerusalem cross" antenna.

51. Apparatus according to claim 43, wherein the supply of the apparatus is not controlled.

52. Apparatus for determining radio-electric radiation characteristics emitted by a device, the apparatus comprising:

at least one sensor so disposed and arranged relative to the device to produce a plurality of sets of simultaneous near field radiation measurements in a measurement surface in the radiation field of the apparatus, wherein said sets of simultaneous measurements are constituted of number of simultaneous measurements greater than two, such as triplets or quadruplets of simultaneous measurement; and a processor arranged responsive to said sets of measurements for estimating at least one statistical property of the radiated fields at a point outside the measurement surface.

53. Apparatus according to claim 52, characterized in that it comprises a first support frame comprising reception means for a measuring apparatus and a second support frame mobile relative to said first support frame, each of the support frames being provided with at least one measuring sensor.

54. Apparatus according to claim 53, characterized in that said first support frame receiving the apparatus to be measured comprise a reception platform for said apparatus, integral with a support arm of a measuring sensor forming a reference probe, the ensemble being mobile around a vertical rotation axis passing substantially though the centre of said reception platform.

55. Apparatus according to claim 53, characterized in that said second support frame is constituted of a fixed arch whose internal profile essentially follows a generatrix of the measurement surface, typically a right angle segment or a circle centered on positioning zone of said apparatus to be measured.

56. Apparatus according to claim 55, characterized in that said fixed arch is provided with a plurality of sensors arranged around the internal circular profile of the arch.

57. Apparatus according to claim 54, characterized in that said first support frame comprises means for disengaging the reception platform relative to the support arm, in such a way as to allow rotation over 360° of said reception platform when the support arm comes up against a stop of the second support frame.

58. Apparatus according to claim 52, characterized in that said sensor are positioned at a distance less than or equal to about one meter from the positioning zone of said apparatus to be measured.

59. Apparatus according to claim 52, characterized in that at least certain of said sensors are each constituted by a so-called "Jerusalem cross" antenna.

60. Apparatus according to claim 52, wherein the supply of the apparatus is not controlled.

* * * * *

UNITED STATES PATENT AND TRADEMARK OFFICE
CERTIFICATE OF CORRECTION

PATENT NO. : 6,850,851 B1
DATED : February 1, 2005
INVENTOR(S) : Fourestie et al.

It is certified that error appears in the above-identified patent and that said Letters Patent is hereby corrected as shown below:

Column 8,
Line 56, (equation), change from " $\overline{E}(M, f_0 t) = \overline{E}_{harm}(M, f_0).z(t)$, " to -- $\overline{E}(M, f_0, t) = \overline{E}_{harm}(M, f_0).z(t)$, --.

Column 9,
Line 10, (equation), change from " $G_{k,l}(f_0) = \lim_{\Delta f \to 0} \lim_{T \to \infty} \frac{1}{T \Delta f} \int_0^{\bullet} zk(t, f_0) z_l^*(t, f_0) dt$ . " to -- $G_{k,l}(f_0) = \lim_{\Delta f \to 0} \lim_{T \to \infty} \frac{1}{T \Delta f} \int_0^{\bullet} zk(t, f_0) z_l^*(t, f_0) dt$ . --.

Line 19, (equation), change from " $G(k,l) = [E\{G_{k,l}(f_0, i)\}_{i \in [1,l]}]$, " to

-- $G(k,l) = [E\{G_{k,l}(f_0, i)\}_{i \in [1,l]}]$, --.

Column 12,
Line 3, after "claim 21" add -- , --.
Line 6, after "coherence" delete ";".

Column 14,
Line 23, after "arch" delete "16", insert -- is --.
Line 63, change "comprise" to -- comprises --.

Signed and Sealed this

Eighth Day of November, 2005

JON W. DUDAS
*Director of the United States Patent and Trademark Office*